(12) United States Patent  
Miller et al.

(10) Patent No.: US 8,471,718 B1  
(45) Date of Patent: Jun. 25, 2013

(54) ELECTRICAL UNIT OUTLET

(75) Inventors: Dennis L. Miller, Bettendorf, IA (US);  
Dwain C. May, Bettendorf, IA (US)

(73) Assignee: Takecharge, LLC, Davenport, IA (US)

(*) Notice: Subject to any disclaimer, the term of this patent is extended or adjusted under 35 U.S.C. 154(b) by 537 days.

(21) Appl. No.: 12/768,724

(22) Filed: Apr. 27, 2010

Related U.S. Application Data

(60) Provisional application No. 61/173,001, filed on Apr. 27, 2009.

(51) Int. Cl.  
*G08B 21/00* (2006.01)

(52) U.S. Cl.  
USPC ............ 340/654; 307/131; 361/118; 439/490

(58) Field of Classification Search  
USPC .................. 340/654, 656; 307/131; 361/115, 361/118; 363/146; 439/490  
See application file for complete search history.

(56) References Cited

U.S. PATENT DOCUMENTS

| | | | |
|---|---|---|---|
| 4,668,878 A | 5/1987 | Wyss | |
| 5,430,598 A | 7/1995 | Rodolfo et al. | |
| 5,742,466 A * | 4/1998 | Kram | 361/118 |
| 6,476,523 B1 | 11/2002 | Lee | |
| 7,651,365 B2 * | 1/2010 | Chien | 439/490 |
| 7,977,825 B2 * | 7/2011 | Gilbert | 307/131 |
| 2004/0218411 A1 * | 11/2004 | Luu et al. | 363/146 |

* cited by examiner

*Primary Examiner* — John A Tweel, Jr.  
(74) *Attorney, Agent, or Firm* — Hamilton IP Law, PC; Jay R. Hamilton; Charles A. Damschen

(57) ABSTRACT

An electrical unit outlet device is disclosed for controlling power isolation, based on a pre-determined time, for a device charger, while remaining plugged into a power outlet. A power isolating circuit cuts any power to the charging device off when charge is complete.

17 Claims, 13 Drawing Sheets

ELECTRICAL UNIT OUTLET

CROSS REFERENCE TO RELATED APPLICATIONS

The present application claims priority from provisional U.S. Pat. App. No. 61/173,001 filed on Apr. 27, 2009, which is incorporated by reference herein in its entirety.

FIELD OF INVENTION

The invention is generally directed to an electrical outlet unit providing surge protection and limiting the electrical power consumption of electrically connectable devices having rechargeable batteries by automatically removing the electrical power to the electrical outlet unit once charging is complete.

STATEMENT REGARDING FEDERALLY SPONSORED RESEARCH OR DEVELOPMENT

No federal funds were used to develop or create the invention disclosed and described in the patent application.

REFERENCE TO SEQUENCE LISTING, A TABLE, OR A COMPUTER PROGRAM LISTING COMPACT DISK APPENDIX

Not Applicable

BACKGROUND

The desired use of rechargeable battery operated devices has created an increasing demand of cordless electronic devices including but not limited to cell phones, PDAs, laptop computers, MP3 players, digital cameras, portable GPS units, cordless personal hygiene products, and cordless hand or yard tools. Often the corresponding chargers remain plugged into a power outlet and consume power when the devices are not being used. This consumed energy has required power plants to accommodate the futile power continuously consumed by the plugged in charger, thus increasing nonrenewable carbon based resources such as coal, oil and natural gas.

The present invention is designed to isolate the charger from the electrical power source when the device battery has reached a maximum charge. When electrical isolation from battery occurs, no power is consumed by the charging device. With power consumption cutoff, no unnecessary power and nonrenewable resources are wasted.

SUMMARY OF THE INVENTION

It is an object of the present invention to provide an apparatus for isolating power in a cordless device's charger while plugged into a power outlet.

It is another object of the present invention to provide an apparatus that will eliminate the waste of power and nonrenewable resources, through power isolation within the device and device charger's circuit.

DETAILED DESCRIPTION

Brief Description of the Figures

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limited of its scope, the invention will be described and explained with additional specificity and detail through the use of the accompanying drawings.

DETAILED DESCRIPTION

Listing of Elements

Figure 1:
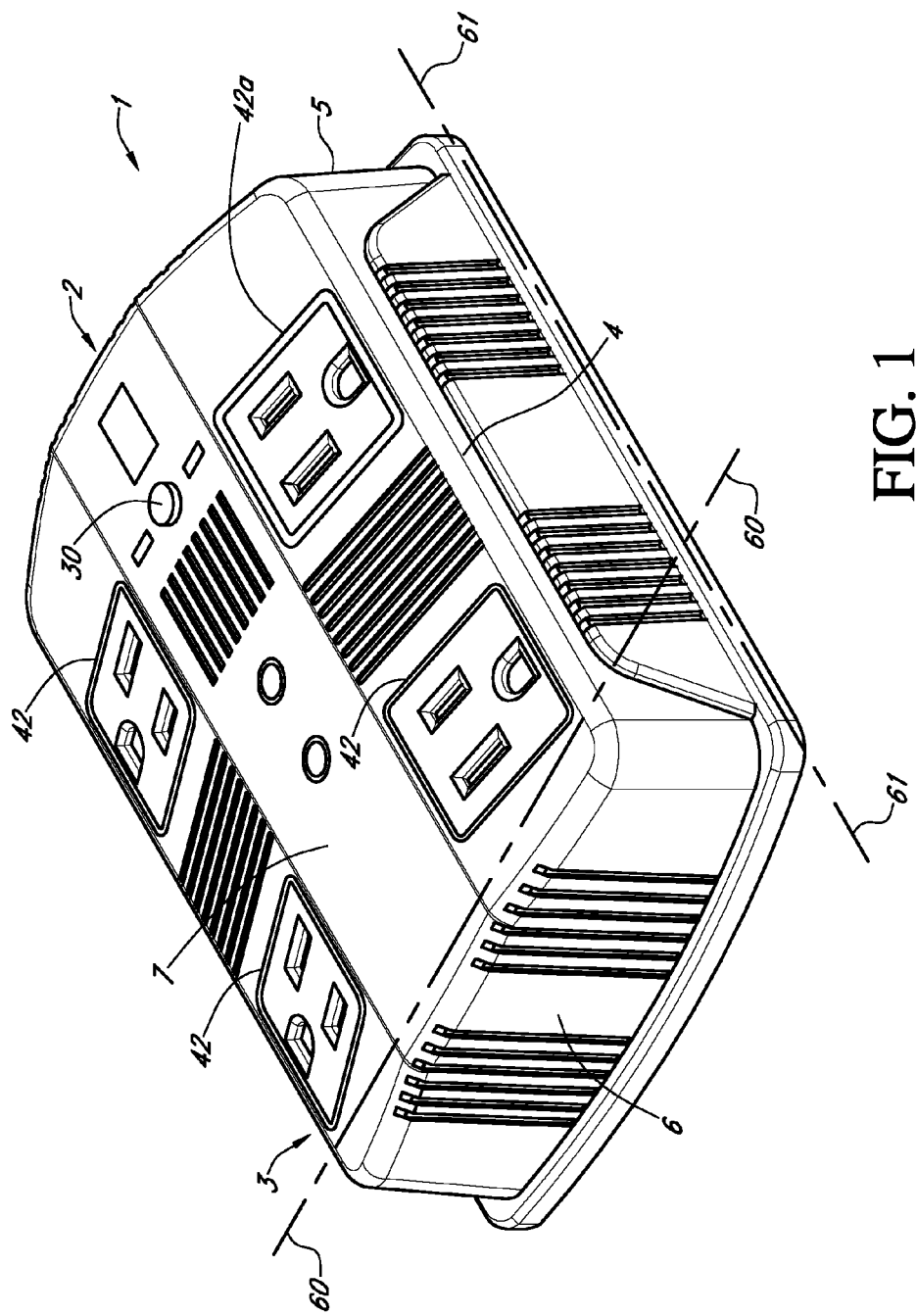
FIG. 1 is a perspective view of one embodiment of an electrical outlet unit subject of the present patent application.
Figure 2:
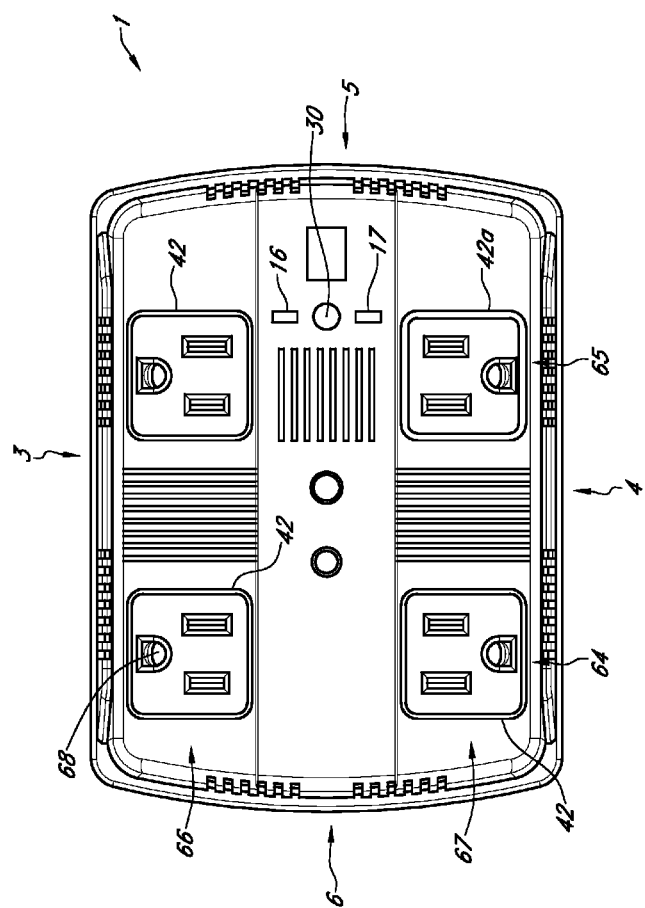
FIG. 2 is a front view of the electrical outlet unit of FIG. 1.
Figure 3:
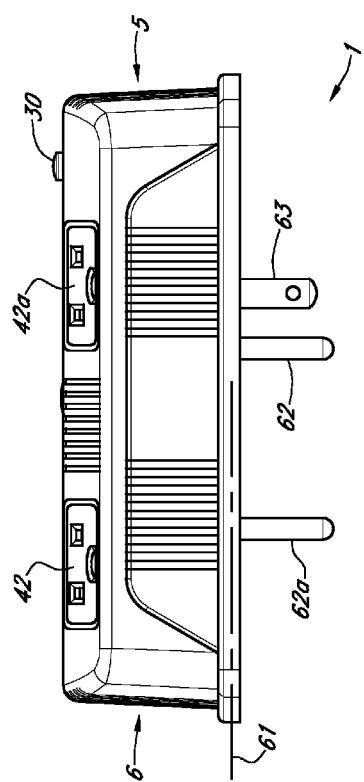
FIG. 3 is a side view of the electrical outlet unit of FIG. 1.
Figure 4:
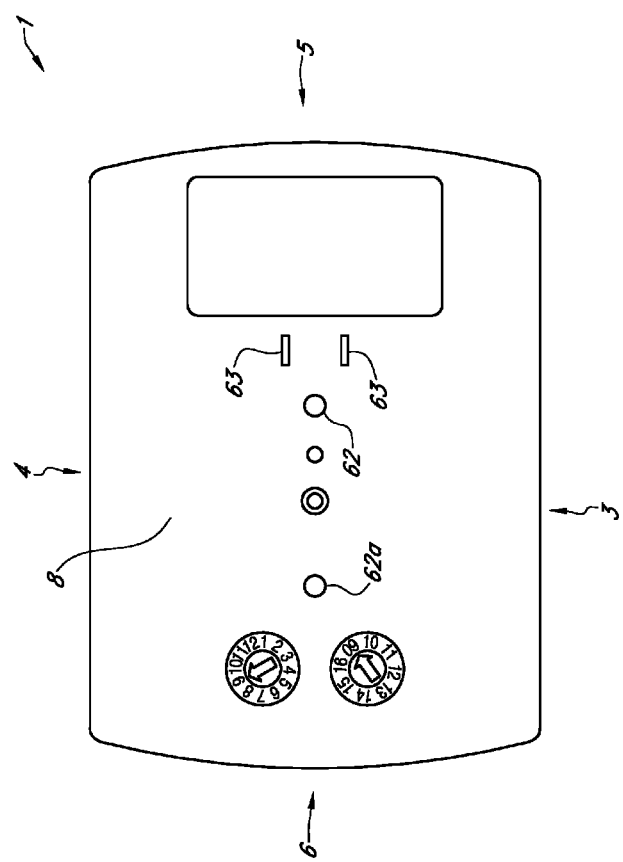
FIG. 4 is a view of the rear side of the electrical outlet unit of FIG. 1

| Element Description | Element Number |
|---|---|
| Electrical Outlet Unit | 1 |
| Housing | 2 |
| First side - housing | 3 |
| Second side - housing | 4 |
| First end - housing | 5 |
| Second end - housing | 6 |
| Front | 7 |
| Rear | 8 |
| Power cord | 9 |
| AC power source | 10 |
| Connection | 11 |
| Surge protection circuit | 12 |
| Distal end | 13 |
| Surge protector resistor | 14 |
| RC timer resistor | 14a |
| Charging status resistor | 14b |
| First power supply resistor | 14c |
| Second power supply resistor | 14d |
| Blank | 15 |
| Surge protector LED (Light Emitting Diode) | 16 |
| Charging Status LED (Light Emitting Diode) | 17 |
| Varistor | 18 |
| Surge protector fuse | 20 |
| Fuse | 20a |
| Power supply | 22 |

-continued

| Element Description | Element Number |
|---|---|
| First power supply zener diode | 24 |
| Second power supply zener diode | 24a |
| Timer Unit | 25 |
| Power supply rectifying diode | 26 |
| Parallel relay snubbing diode | 26a |
| Power supply capacitor | 28 |
| RC timer capacitor | 28a |
| Initiation switch (push button) | 30 |
| RC timer | 32 |
| Relay driver | 34 |
| Relay | 36 |
| Relay coil | 38 |
| Relay contacts | 40 |
| Electrical receptacle (AC Outlets) | 42 |
| Power isolation circuit | 44 |
| AC source hot line | 46 |
| AC outlet hot line | 46a |
| AC source neutral line | 48 |
| AC outlet neutral line | 48a |
| AC source ground line | 50 |
| AC outlet ground line | 50a |
| Optocoupler | 52 |
| Device charger | 54 |
| Device battery | 56 |
| Transformer | 58 |
| Blank | 59 |
| Transverse Axis - Housing | 60 |
| Longitudinal Axis - Housing | 61 |
| Ground prong (male) | 62 |
| Blade | 63 |
| Column 1 | 64 |
| Column 2 | 65 |
| Row 1 | 66 |
| Row 2 | 67 |
| Ground connection (female) | 68 |

Detailed Description

Before the various embodiments of the present invention are explained in detail, it is to be understood that the invention is not limited in its application to the details of construction and the arrangements of components set forth in the following description or illustrated in the drawings. The invention is capable of other embodiments and of being practiced or of being carried out in various ways. Also, it is to be understood that phraseology and terminology used herein with reference to device or element orientation (such as, for example, terms like "front", "back", "up", "down", "top", "bottom", and the like) are only used to simplify description of the present invention, and do not alone indicate or imply that the device or element referred to must have a particular orientation. In addition, terms such as "first", "second", and "third" are used herein and in the appended claims for purposes of description and are not intended to indicate or imply relative importance or significance.

Referring to FIGS. 1-5, wherein like reference numerals designate identical or corresponding parts throughout the several views, and to the following description, it can be understood that the present invention may be embodied in an electrical outlet unit 1 which comprises a housing 2 which includes a first side 3 and a second side 4. A transverse axis 60 extends between the first side 3 and the second side 4. The housing 2 further includes a first end 5 and a second end 6. A longitudinal axis 61 extends between the first end 5 and the second end 6. Housing 2 further includes a front 7 and a rear 8. Housing 2 can be formed in various colors and of various materials. As required by codes and the market, the housing may also be constructed of non-conductive plastic and or insulated. FIGS. 1-5 are of an embodiment of an electrical outlet unit 1 which is to be mounted to a standard AC power outlet 10 (commonly referred to as a "wall socket") having 2 or 4 electrical receptacles during operation. A wall mounted AC power electrical receptacle is not shown as they are well known in the art and similar in design to the electrical receptacles 42 shown herein. The electrical charge outlet unit as shown in FIGS. 1-5 includes a second grounding prong 62a mounted to the housing which serves to fully engage the outlets to which the unit may be mounted stabilizing the electrical outlet unit 1. Additionally, the second grounding prong may be electrically connected to the grounding circuit.

Figure 6:
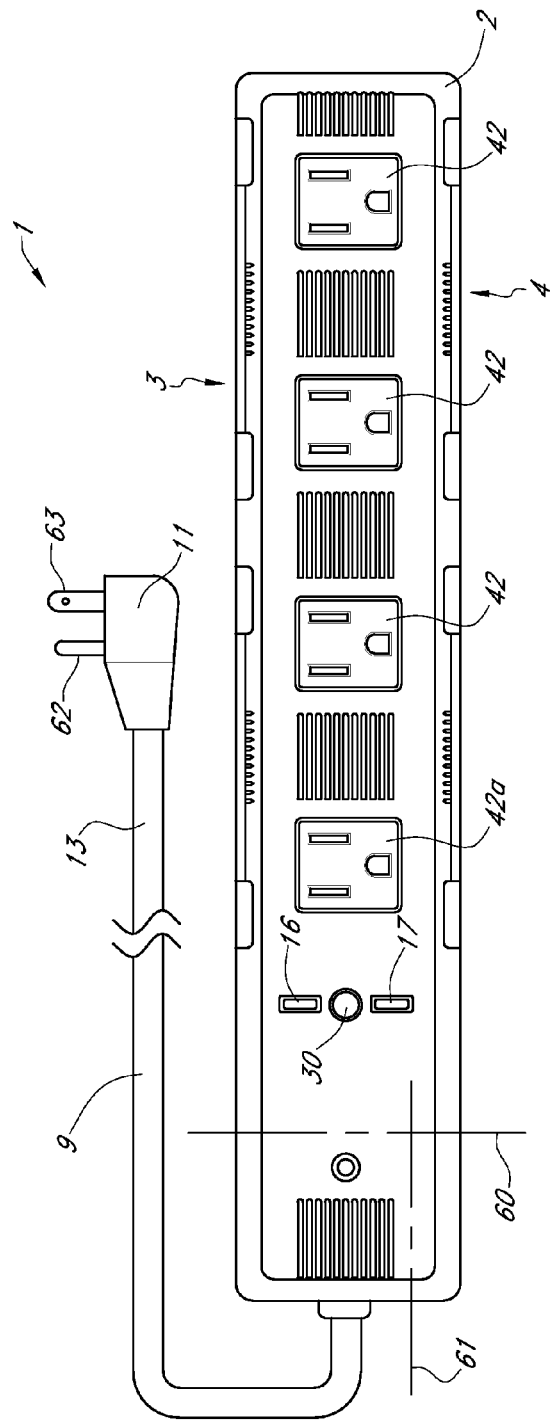
FIG. 6 is a front view of another embodiment of an electrical outlet unit subject of the present patent application.
Figure 7:
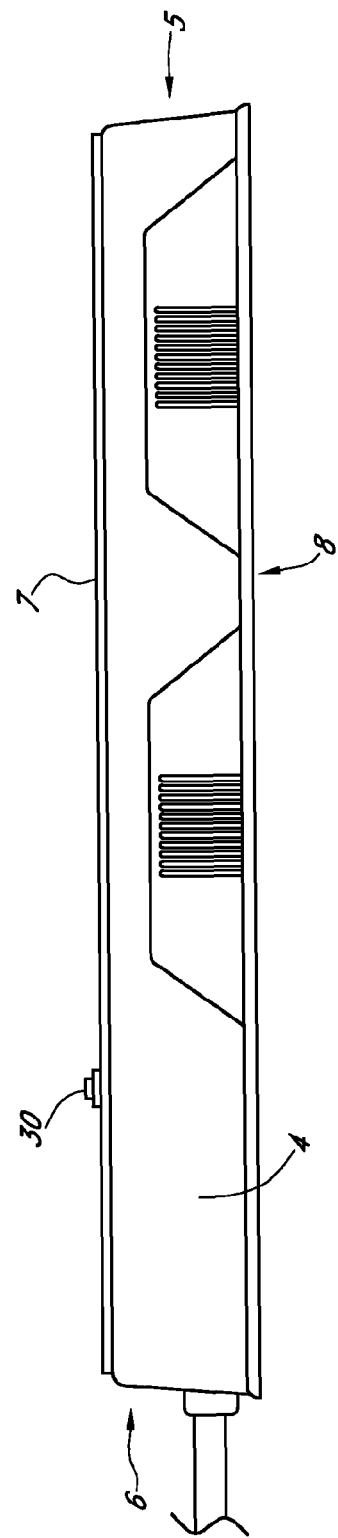
FIG. 7 is a side view of the electrical outlet unit of FIG. 6.

Referring to FIGS. 6-7, wherein like reference numerals designate identical or corresponding parts throughout the several views, and to the following description, it should be understood that the present invention, without limitation, may also be embodied in an electrical outlet unit 1 having a cord 9 attached therein which also comprises a housing 2 which includes a first side 3 and a second side 4. A transverse axis 60 extends between the first side 3 and the second side 4. The housing 2 further includes a first end 5 and a second end 6. A longitudinal axis 61 extends between the first end 5 and the second end 6. Housing 2 further includes a front 7 and a rear 8. The housing 2 of this embodiment may also be formed in various colors and of various materials. As required by codes and the market, this housing 2 may also be constructed of non-conductive plastic and or insulated. The power cord 9 is connected to housing 2 and has a connection 11 on a distal end 13 thereof that is shaped and sized to electrically connect to an AC power source 10 such as an electrical outlet receptacle of a home, office or the like. One of ordinary skill will appreciate that the embodiments shown in either FIG. 1 or 6 may have more or less grounded electrical receptacles.

Figure 5:
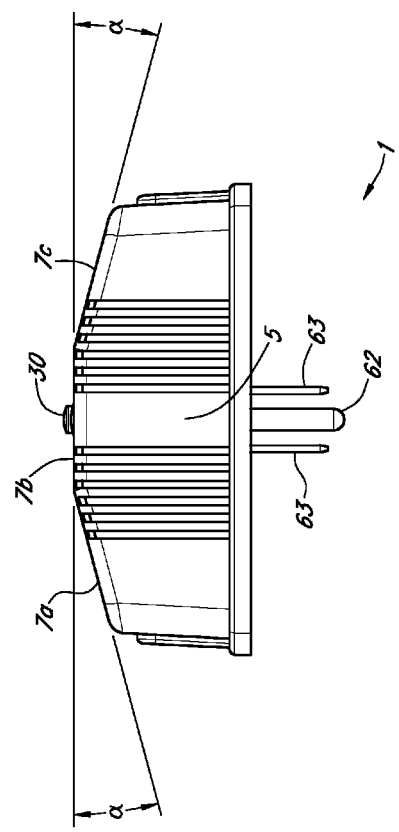
FIG. 5 is a top view of the electrical outlet unit of FIG. 1.

A plurality of grounded electrical outlet receptacles 42 (alternatively referred to as AC power outlets) are located on the front of housing 2. In the example shown in FIGS. 1-5, the grounded electrical receptacles are arranged in two columns 64 and 65 and two rows 66 and 67. As can be understood from FIG. 1, the columns 64, 65 are spaced apart from each other along the transverse axis 60 of the housing and the rows 66, 67 are spaced apart from each other along the longitudinal axis 61 of the housing 2. Each outlet receptacle 42 has a ground connection, such as ground connection 68. As best shown in FIGS. 1 and 5, profile of the front side (face) 7 of the electrical outlet unit 1 is non-linear and allows positioning the electrical outlet receptacles at an angle below the transverse axis 60 of the front side 7. The advantage of this profile is that it allows for insertion and use of cords having a bulky connection end at the distal end of the cord therein (not shown). FIG. 5 illustrates the angled relation of front side 7 having faces 7a, 7b, and 7c.

Electrical Outlet Unit 1 includes a timer unit 25 within the housing 2. Timer unit 25 includes an electrical circuit which may be connected to each outlet receptacle of the plurality of grounded electrical outlet receptacles 42 to control operation of those receptacles as will be understood from the teaching of this disclosure. As disclosed and claimed herein, the exemplary embodiments, without limitation, have the timer unit 25 connected to all but one of the grounded electrical receptacles. Having one grounded receptacle always "hot" allows the electrical outlet unit to function as surge protector when the timing function is not beneficial or needed.

An electrical surge protector circuit 12 is located in housing 2 and is electrically connected to each outlet receptacle of the plurality of grounded electrical outlet receptacles 42. The surge protector circuit 12 is common to power strips and thus will not be further discussed as those skilled in the art will understand what elements and connections are required for the surge protector circuit 12. A grounding circuit electrically connects the grounding circuit of each of the grounded outlet receptacles to the grounded conductor of the power cord 9 or the ground prongs 62 and blades 63 of the wall mounted embodiment of the electrical outlet unit 1. An initiation switch 30 is located on the housing 2. As indicated in FIGS. 1, 6, 8A and 8B, initiation switch 30 is electrically interposed between power 22 and the electrical surge protector circuit 12 and between power 22 and the timer unit circuit 25. Initiation switch 30 includes an "off" position which electrically disconnects the electrical surge protector circuit 12 from power 22 when the initiation switch 30 is in an "off" condition, a "charging" position which electrically connects the electrical surge protector circuit 12 to the power supply 22 when the initiation switch 30 is in "charging" condition which electrically connects the timer unit 25 to power 22 when the initiation switch 30 is in a "charging" condition. The "charging" position and the "off" position are mutually exclusive of each other so that when the initiation switch is in one of the positions, it cannot be in any other of the positions. That is, if the initiation switch 30 is in a "charging" (on) configuration, the timer unit 25 will be activated and the electrical outlet receptacles will be powered during the charging cycle. If the initiation switch 30 is "off", the timer unit 25 will be de-activated and the electrical outlet receptacles connected to the timer unit 25 will not be powered.

Operation and Circuitry of a First Exemplary Embodiment

Figure 8A:
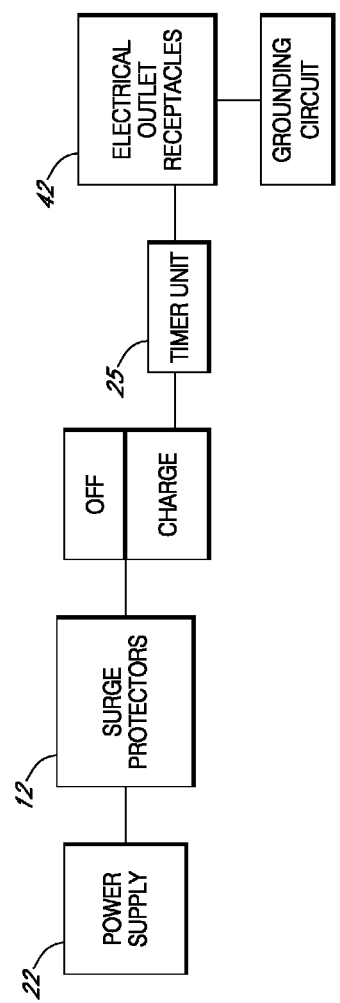
FIG. 8A is a simplified diagram of an exemplary electrical system for an electrical outlet receptacle connected to and or controlled by the timer unit.
Figure 9:
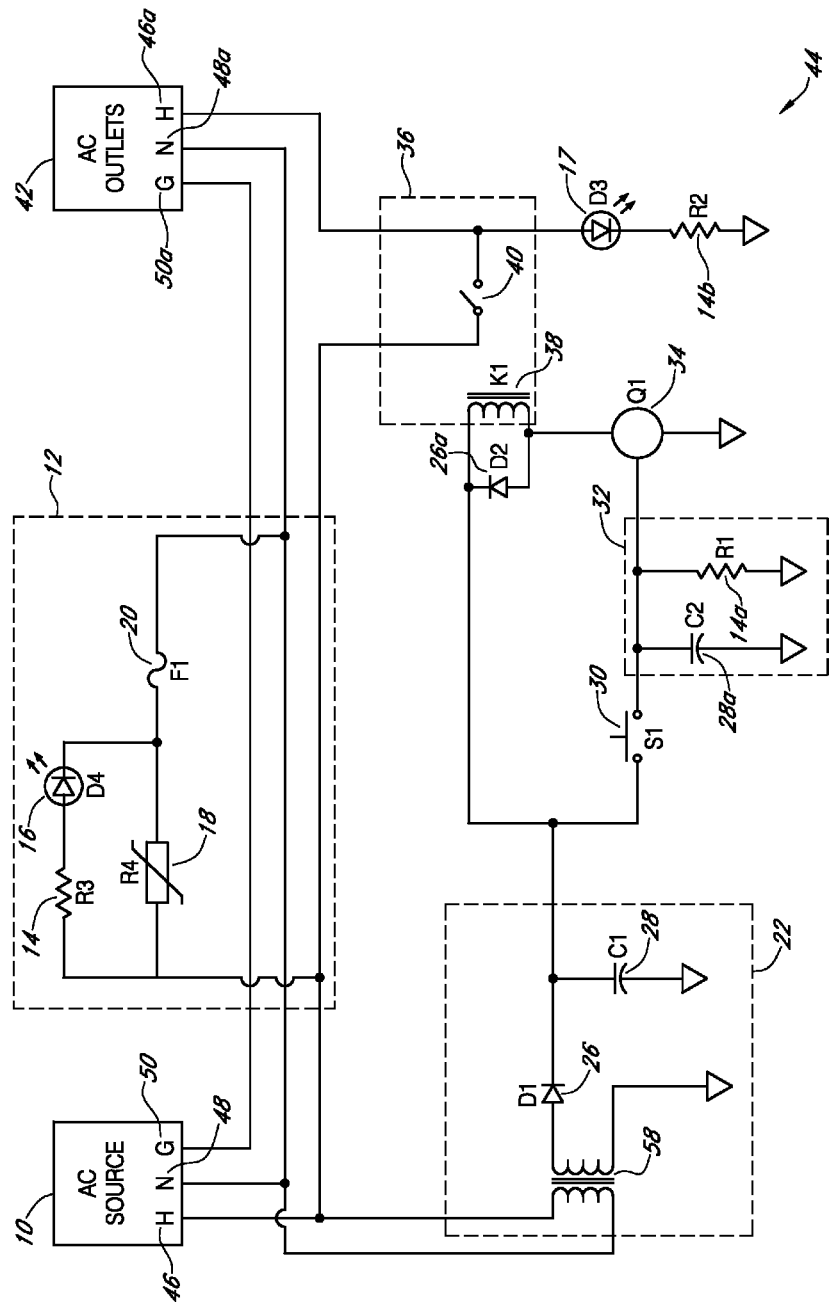
FIG. 9 provides a diagram of a first exemplary embodiment of the power isolation circuitry of a timer unit of an exemplary embodiment of an electrical outlet unit.
Figure 11A:
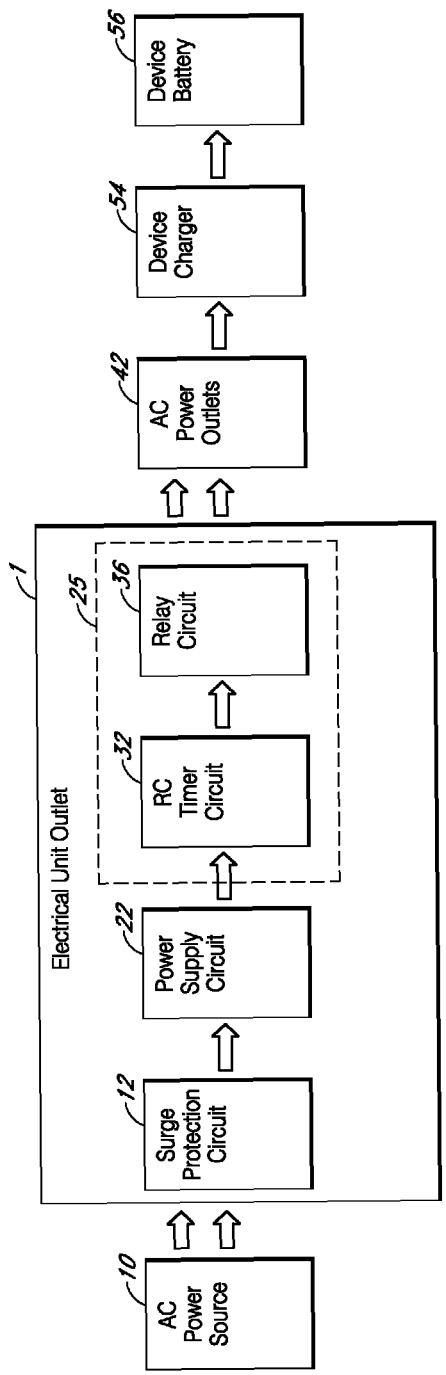
FIG. 11A provides a simplified flow diagram of an exemplary electrical outlet unit having the circuitry of FIG. 9 connected to a device having a rechargeable battery during charging.

FIGS. 8A, 9 and 11A, and the descriptions that follow, describe a first exemplary embodiment of the power isolating circuit 44 of the electrical outlet 1. As is well known to those skilled in the art, several circuitry components may be used in conjunction with one another depending on the proper values to which circuitry can isolate power at a desired time. As shown in the various figures herein, when the alternating current (AC) source 10 is connected to a standard household 125 volt electrical outlet, electricity is sent to the surge protector circuit 12. As long as the fuse 20 has not opened by a short, the status indicator LED 16 will illuminate indicating the surge protector is functioning. A resistor 14 is used to limit the electrical current through the status indicator LED 16, to keep the status indicator LED 16 from failing due to excessive electrical current. A varistor 18 reduces resistance if or when voltage reaches an excessive trip point. When the voltage trip point is reached, the varistor 18 conducts or discharges electricity. Through conduction or discharge through varistor 18 the resulting power surge between AC source 10 hot line 46 and the AC source 10 neutral line 48 is shorted (absorbed). The shortage provides protection to devices plugged into Power Outlets 42 from a power surge. Trip voltage is reduced each time the trip point of the varistor 18 is reached. This voltage reduction eventually reduces the trip voltage to the applied line voltage. The varistor 18 will cause a direct short between the AC source 10 hot line 46 and AC source 10 neutral line 48 causing the fuse 20 to burn open once trip voltage is reduced to line voltage. When said fuse 20 has opened, the status indicator LED 16 will turn off indicating surge protection of the power isolating circuit 12 is no longer functioning.

Concurrently, when AC source 10 is connected to a standard household 125 volt electrical outlet, electricity is also sent to the power supply 22. The power supply transformer 58 reduces the 125 volts AC down to 12 volts AC. The AC voltage is rectified to pulsating DC by rectifying diode 26 and then filtered to DC by a fixed polarized capacitor 28. This low voltage DC is then used by the RC timer 32 which is primarily composed of a RC timer fixed polarized capacitor 28a, and RC timer resistor 14a.

The charge cycle transmission begins through engagement of initiation switch 30 allowing current to flow through the initiation switch 30. As of ordinary skill will appreciate, the initiation switch may be a push button, a throw switch or any type of switch that may be engaged by a user. As current flows through initiation switch 30, the RC timer fixed polarized capacitor 28a is charged to the power supply 22 Voltage. When the initiation switch 30 is released an RC timer resistor 14a will slowly discharge said RC timer fixed polarized capacitor 28a. The discharge time of the preferred embodiment has been set but not limited to four hours by the RC timer resistor 14a and the RC timer fixed polarized capacitor 28a. One of ordinary skill will appreciate that other times may be selected and the selection of 4 hours is no way limiting.

A relay driver 34 is an N channel FET used as an output driver by the RC Timer 32. While the charge in the RC timer fixed polarized capacitor 28a is above the relay driver 34 gate to source voltage threshold, the relay driver 34 will conduct turning on the relay 36. When the relay 36 is on, the relay contacts are closed sending AC power from the AC source 10 to the charging status LED 17 indicator. As a result, the charging status LED 17 indicates the charge cycle is in progress. A series relay resistor 14b is used to limit the electrical current through the charging status LED 17, to keep the charging status LED 17 from failing from excessive electrical current. Additionally, while the relay 36 contacts 40 are closed, AC power is sent to the AC outlets 42. This location is where battery chargers are plugged into the electrical unit outlet 1.

After the set, but not limited to, four hours of charging in the RC timer fixed polarized capacitor 28a will drop below the gate to source voltage threshold of the relay driver 34. As a result, this will cause the relay driver 34 to cease conducting, turning off relay 36 causing the contacts 40 to open. When the contacts 40 open AC power is disconnected from charging status indicator LED 17 causing the light to go out indicating the charge cycle is complete. When the contacts 40 open, AC power is removed from the AC outlets turning off any device plugged into the electrical unit outlet 1.

When relay 36 turns off, the collapsing magnetic field of the relay coil 38 will cause voltage spike which has the potential to kill the relay driver 34. To protect the relay driver 34 a parallel relay snubbing diode 26a has been connected across the relay coil 38 which negates the voltage spike generated by the coil. FIG. 11A illustrates an exemplary block diagram of the combination of circuits illustrated by FIG. 9 working together to form a timing unit 25 using an RC timer circuit 32 and as relay circuit 36 in an exemplary embodiment of an electrical unit outlet 1.

Operation and Circuitry of a Second Exemplary Embodiment

Figure 8B:
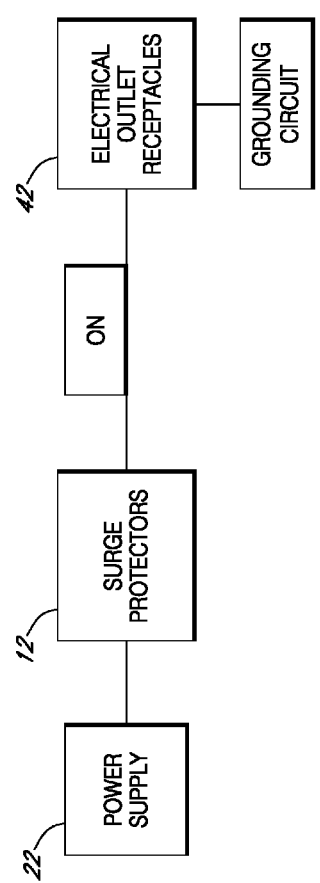
FIG. 8B is a simplified diagram of an exemplary electrical system for an electrical outlet receptacle not connected to and or controlled by the timer unit.
Figure 10:
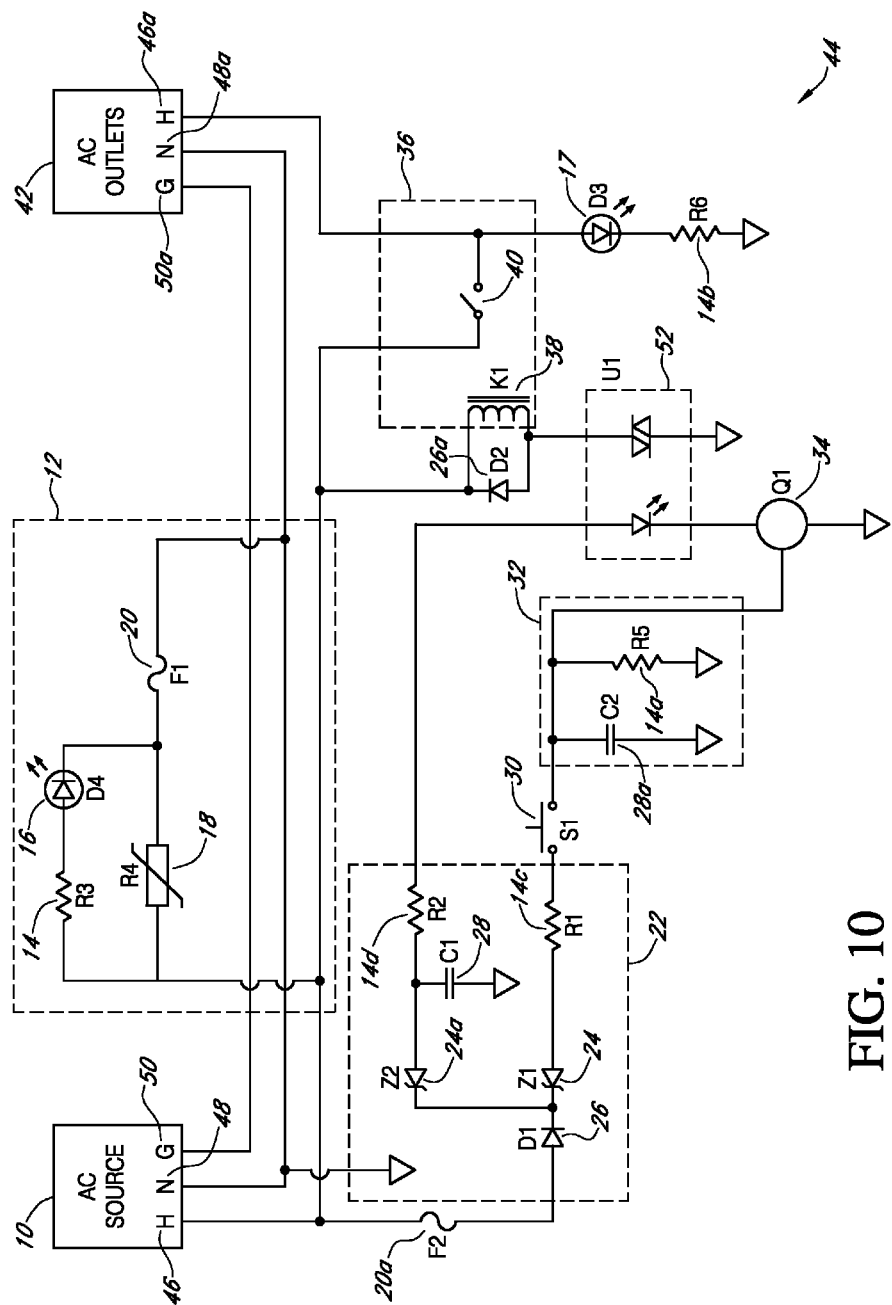
FIG. 10 provides a diagram of a second exemplary embodiment of the power isolation circuitry of a timer unit of an exemplary embodiment of an electrical outlet unit.
Figure 11B:
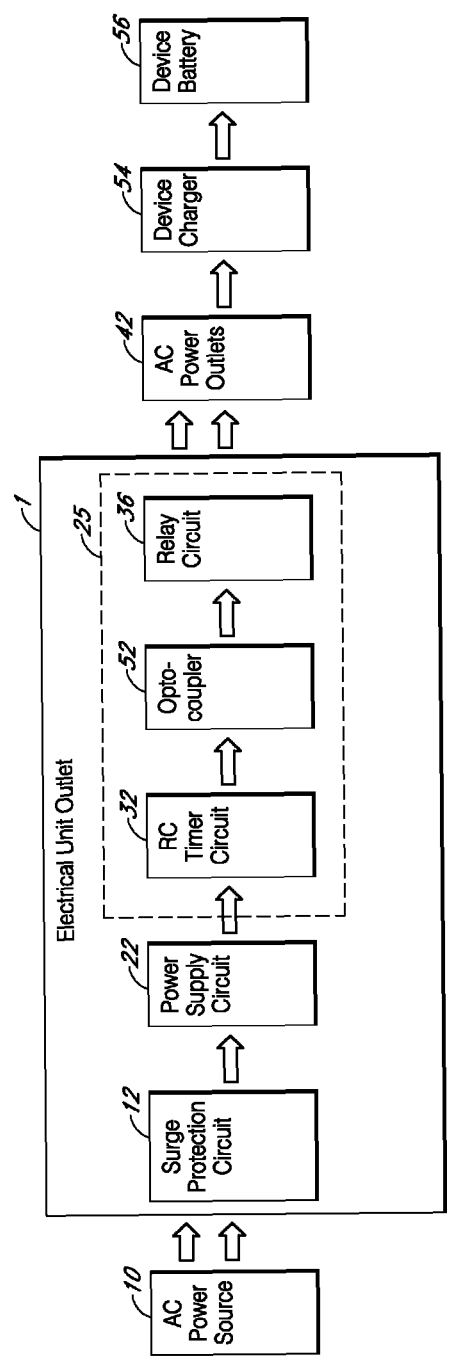
FIG. 11B provides a simplified flow diagram of an exemplary electrical outlet unit having the circuitry of FIG. 10 connected to a device having a rechargeable battery during charging.

FIGS. 8B, 10 and 11B, and the descriptions that follow, describe a second exemplary embodiment of the power isolating circuit 44. In this embodiment, a fuse 20a was added to the circuit's power supply to isolate electricity flow to the power supply 22 when the fuse 20a is not opened by a short in the circuit. The power supply 22 in the second embodiment is now comprised of a rectifying diode 26, a zener diode 24, a second zener diode 24a, a capacitor 28, a resistor 14c, and a second resistor 14d. The AC voltage is then rectified to pulsating DC by power supply rectifying diode 26 and then regulated to approximately 15 Volts by a first and second zener diode (24, 24a). The second zener diode 24a output is then filtered to DC by a capacitor 28. The filtered DC is the power source used by an optocoupler 52 which acts as an opto-isolator. As one of ordinary skill will appreciate, the optocoupler uses an optical transmission path to transfer a signal between the various elements of the circuitry while maintaining electrical isolation because the signal goes from an electrical signal to an optical signal back to an electrical signal, electrical contact along the circuit path is broken.

A resistor 14d is used to limit the current through optocoupler 52 on the input side. The low voltage pulsating DC output of a first zener diode 24 is used by the RC timer 32, comprising of a capacitor 28a and a resistor 14a. The RC timer 32 controls the length of the charge cycle for the devices connected to the power isolating circuit's AC power outlets 42. When the push switch 30 is engaged, current flows through, charging a capacitor 28a to the added second zener diode 24a voltage of 15 Volts. The power supply resistor 14c is used to limit the current rushing in from the RC timer capacitor 28a. When the initiation push switch 30 is released, the resistor 14a will slowly discharge RC timer capacitor 28a. While the charge in the RC timer capacitor 28a is above the relay driver 34 gate to source voltage threshold, the relay driver 34 will conduct turning the optocoupler 52 on, which in turn powers up the relay 36. The optocoupler 52 will turn off, in turn, turning off the relay 36 causing the contacts to open when the relay driver 34 stops conducting at the end of a charge cycle. FIG. 11B illustrates an exemplary block diagram of the combination of circuits illustrated by FIG. 8B and FIG. 10 working together to form another version of electrical unit outlet 1.

Furthermore, although not shown, one of ordinary skill will appreciate that the electrical unit outlet may be embodied in any one of several implementations including as a stand-alone unit mounted in a plastic housing with at least one cord connectable to an ac outlet and having at least one, and preferably several, ac receptacles into which the device charger 54 for a device having rechargeable batteries 56 may be connected. In another embodiment, not shown, the initiation switch may also be remotely mounted as a stand-alone unit allowing the power isolation circuit 44 of the electrical unit outlet 1, to be mounted in an outlet that is not easily accessible. This remote mounted initiation switch could be linked to the electrical unit outlet 1, power isolation circuit 44, by wire(s) or a wireless system.

Having described several exemplary embodiments, other features of the present invention will undoubtedly occur to those versed in the art, as will numerous modifications and alterations in the embodiments of the invention illustrated, including other combinations of circuits and components to limit the amount of time a device having a rechargeable battery may draw electric current, all of which may be achieved without departing from the spirit and scope of the invention.

The invention claimed is:

1. An electrical outlet unit comprising:
   a. a housing which includes (1) a first side, (2) a second side, (3) a transverse axis extending between the first side and the second side, (4) a first end, (5) a second end, (6) a longitudinal axis extending between the first end and the second end, (7) a front, and (8) a rear;
   b. a power plug connected to said housing that is shaped and sized to electrically connect to a power source whereby elements electrically connected to said power plug are connected to power via said power plug;
   c. a plurality of grounded electrical outlet receptacles located on the front of said housing and being arranged in columns and rows, with the columns being spaced apart from each other along the transverse axis of said housing and the rows being spaced apart from each other along the longitudinal axis of said housing, each outlet receptacle having a ground connection;
   d. a timer unit located within said housing which may be initiated from the exterior of said housing, said timer unit including a timing circuit electrically connected to each outlet receptacle of said plurality of grounded electrical outlet receptacles;
   e. an electrical surge protector circuit in said housing and electrically connected to each outlet receptacle of said plurality of grounded electrical outlet receptacles; and,
   f. a grounding circuit electrically connecting the grounding circuit of each of said grounded outlet receptacles to a grounded conductor of the power plug;
   g. an initiation switch on said housing, said initiation switch being electrically interposed between said power plug and said electrical surge protector circuit and including (1) a "charging" position which electrically connects said electrical surge protector circuit to said power source and to said timing circuit, and a "non-charging" position which electrically disconnects said electrical surge protector circuit from said power source when said initiation switch is in a "non-charging" condition to said timing circuit, and,
   h. the "non-charging" position and the "charging" position of said initiation switch being mutually exclusive of each other so that when said initiation switch is in one of said positions, it cannot be in any other of said positions.

2. The electrical charge outlet unit according to claim 1 wherein said housing is a plastic enclosure.

3. The electrical charge outlet unit according to claim 1 wherein said power plug is comprised of at least one three prong male plug having at least one hot blade, at least one neutral blade and at least one grounding blade.

4. The electrical charge outlet unit according to claim 3 wherein a second grounding blade is mounted to said housing and is electrically connected to said grounding circuit.

5. The electrical charge outlet unit according to claim 1 wherein a status LED is electrically connected to said electrical surge suppression circuit to indicate proper function of said electrical surge suppression circuit.

6. The electrical charge outlet unit according to claim 1 having 1 to 4 electrical receptacles.

7. The electrical charge outlet unit according to claim 1 wherein at least one said electrical receptacle is not connected to said timing circuit and power to said at least one electrical receptacle is controlled by said electrical surge protector circuit.

8. The electrical charge outlet unit according to claim 1 wherein said first side is composed of a first face, a second face and a third face in adjacent relation to each other along the transverse axis of said housing formed by said second face wherein said first and third faces are at an angle to said transverse axis.

9. A power strip unit comprising:
   a. a housing which includes (1) a first side, (2) a second side, (3) a transverse axis extending between the first side and the second side, (4) a first end, (5) a second end, (6) a longitudinal axis extending between the first end and the second end, (7) a front, and (8) a rear;
   b. a power cord is connected to said housing and having a connection on a distal end thereof that is shaped and sized to electrically connect to a power source whereby elements electrically connected to said power cord are connected to power via said power cord;
   c. a plurality of grounded electrical outlet receptacles located on the front of said housing and being arranged in columns and rows, with the columns being spaced apart from each other along the transverse axis of said housing and the rows being spaced apart from each other along the longitudinal axis of said housing, each outlet receptacle having a ground connection;

d. a timer unit located within said housing which may be initiated from the exterior of said housing, said timer unit including a timing circuit electrically connected to each outlet receptacle of said plurality of grounded electrical outlet receptacles;

e. an electrical surge protector circuit in said housing and electrically connected to each outlet receptacle of said plurality of grounded electrical outlet receptacles;

f. a grounding circuit electrically connecting the grounding circuit of each of said grounded outlet receptacles to a grounded conductor of the power cord;

g. an initiation switch on said housing, said initiation switch being electrically interposed between said power cord and said electrical surge protector circuit and including (1) a "non-charging" position which electrically disconnects said electrical surge protector circuit from power when said initiation switch is in a "non-charging" condition and (2) a "charging" position which electrically connects said electrical surge protector circuit to power and to said timing circuit, and, h. the "non-charging" position and the "charging" position of said initiation switch being mutually exclusive of each other so that when said initiation switch is in one of said positions, it cannot be in any other of said positions.

10. The electrical charge outlet unit according to claim 9 having 1 to 8 electrical receptacles.

11. The electrical charge outlet unit according to claim 9 wherein at least one said electrical receptacle is not connected to said timing circuit, thereby maintaining electrical power to said at least one electrical receptacle.

12. The electrical charge outlet unit according to claim 9 wherein a status LED is electrically connected to said electrical surge suppression circuit to indicate proper function of said electrical surge suppression circuit.

13. An electrical outlet unit comprising:
  a. A housing;
  b. A main electrical inlet for receiving electricity from an external alternating current power source;
    i. A plurality of electrical outlets for discharging electricity wherein said main electrical inlet and said plurality of electrical outlets are mounted to said housing and are electrically connected by a plurality of cooperating circuits further comprising:
      1. A surge protection circuit, wherein said surge protection circuit is connected to said alternating current power source;
      2. A power supply circuit, wherein said surge protection circuit diverts current having a voltage potential above a predetermined value away from said power supply circuit;
      3. A RC timer circuit, wherein said RC timer circuit is electrically connected to said power supply circuit;
      4. A relay circuit, wherein said RC timer circuit is electrically connected to said power supply circuit and wherein at least one relay contact opens to isolate said electrical power source from said plurality of electrical outlets or said at least one relay contact closes to allow electrical power to flow from said electrical power source to said plurality of electrical outlets; and,
    ii. wherein said RC timer circuit controls the duration current is allowed to flow from said power supply circuit to said relay circuit to said plurality of said electrical outlets.

14. The electrical outlet unit according to claim 13 wherein said housing is a plastic enclosure and a cord is electrically connected at a first end to said main electrical inlet and said cord second end is a standard grounded duplex 110-125 volt male prong.

15. The electrical outlet unit according to claim 13 having 1 to 6 receptacles adapted to allow a device charger to be connected.

16. The electrical outlet unit according to claim 13 wherein a status LED is electrically connected to said surge suppression circuit to indicate proper function.

17. The electrical outlet unit according to claim 13 wherein an initiation switch is electrically connected between said power supply circuit and said RC timer circuit, and said power supply resistor limits current flow to said RC timer capacitor.

* * * * *